(12) United States Patent
Kuo et al.

(10) Patent No.: US 10,694,639 B2
(45) Date of Patent: Jun. 23, 2020

(54) STORAGE DEVICE AND HARD DRIVE WITH HEAT DISSIPATION FUNCTION

(71) Applicant: ADATA TECHNOLOGY CO., LTD., New Taipei (TW)

(72) Inventors: Tsung-Hsing Kuo, Taipei (TW); Jen-Chieh Pan, New Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/183,687

(22) Filed: Nov. 7, 2018

(65) Prior Publication Data

US 2020/0068743 A1 Feb. 27, 2020

(30) Foreign Application Priority Data

Aug. 22, 2018 (TW) .............................. 107129310 A

(51) Int. Cl.
*H05K 7/20* (2006.01)
*H05K 5/03* (2006.01)
*G11B 33/14* (2006.01)
*H05K 5/00* (2006.01)
*H05K 5/02* (2006.01)

(52) U.S. Cl.
CPC ..... *H05K 7/20236* (2013.01); *G11B 33/1413* (2013.01); *H05K 5/0026* (2013.01); *H05K 5/0247* (2013.01); *H05K 5/03* (2013.01)

(58) Field of Classification Search
CPC ............. H05K 7/20236; H05K 5/0026; H05K 5/0247; H05K 5/03; G11B 3/1413
See application file for complete search history.

(56) References Cited

U.S. PATENT DOCUMENTS

| 3,741,292 | A | 6/1973 | Aakalu et al. |
| 6,992,888 | B1 | 1/2006 | Iyer |
| 7,414,838 | B2 * | 8/2008 | Yeh ...................... G11B 33/142 360/97.12 |
| 9,872,415 | B2 * | 1/2018 | Moss ................. H05K 7/20818 |
| 2006/0152899 | A1 * | 7/2006 | Wang .................... G06F 1/1632 361/679.32 |
| 2010/0296236 | A1 * | 11/2010 | Schuette ................. G06F 1/187 361/679.31 |

FOREIGN PATENT DOCUMENTS

| CN | 104321939 A | 1/2015 |
| TW | 201419673 A | 5/2014 |
| TW | M513441 U | 12/2015 |

* cited by examiner

*Primary Examiner* — Anthony Q Edwards
(74) *Attorney, Agent, or Firm* — Li & Cai Intellectual Property (USA) Office

(57) ABSTRACT

A storage device and a hard drive with a heat dissipation function are provided. The hard drive with the heat dissipation function includes a case, a storage module, and a working fluid. The case includes an accommodation space. The storage module is disposed in the accommodation space of the case. The working fluid is disposed in the accommodation space of the case. The storage module is immersed in the working fluid so that heat generated by the storage module is conducted from the working fluid to the case.

15 Claims, 14 Drawing Sheets

US 10,694,639 B2

STORAGE DEVICE AND HARD DRIVE WITH HEAT DISSIPATION FUNCTION

CROSS-REFERENCE TO RELATED PATENT APPLICATION

This application claims the benefit of priority to Taiwan Patent Application No. 107129310, filed on Aug. 22, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a storage device and a hard drive, and more particularly to a storage device and a hard drive with a heat dissipation function.

BACKGROUND OF THE DISCLOSURE

The operational efficiency of a storage device is closely related to the operating temperature. When the storage device operates in a high-performance state for a long period of time, the temperature of the storage device rises and thus the transmission speed of the storage device decreases. In this way, the storage device cannot continuously operate in the high-performance state.

In the conventional art, the temperature of the storage device is lowered by using a fan or fins. However, it is considered inefficient to use the fan or fins to dissipate heat of the storage device. Therefore, in order to overcome the above issues, how to improve the efficiency in heat dissipation of the storage device has become one of the important issues to be solved in the art.

SUMMARY OF THE DISCLOSURE

In response to the above-referenced technical inadequacies, the present disclosure provides a storage device and a hard drive with a heat dissipation function.

In one aspect, the present disclosure provides a hard drive with a heat dissipation function. The hard drive includes a case, a storage module and a working fluid. The case includes an accommodation space. The storage module is disposed in the accommodation space of the case. The working fluid is disposed in the accommodation space of the case. The storage module is immersed in the working fluid so that heat generated by the storage module is conducted from the working fluid to the case.

In one aspect, the present disclosure provides a storage device with a heat dissipation function. The storage device includes a case, a storage module and a working fluid. The case includes an accommodation space. The storage module is disposed in the accommodation space of the case. The working fluid is disposed in the accommodation space of the case. The storage module is immersed in the working fluid.

Therefore, one of the beneficial effects of the present disclosure is that with the technical solution that "the working fluid is disposed in the accommodation space of the case and the storage module is immersed in the working fluid," the storage device and the hard drive with the heat dissipation function provided by the present disclosure improve the efficiency in heat dissipation of the storage device or the hard drive.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
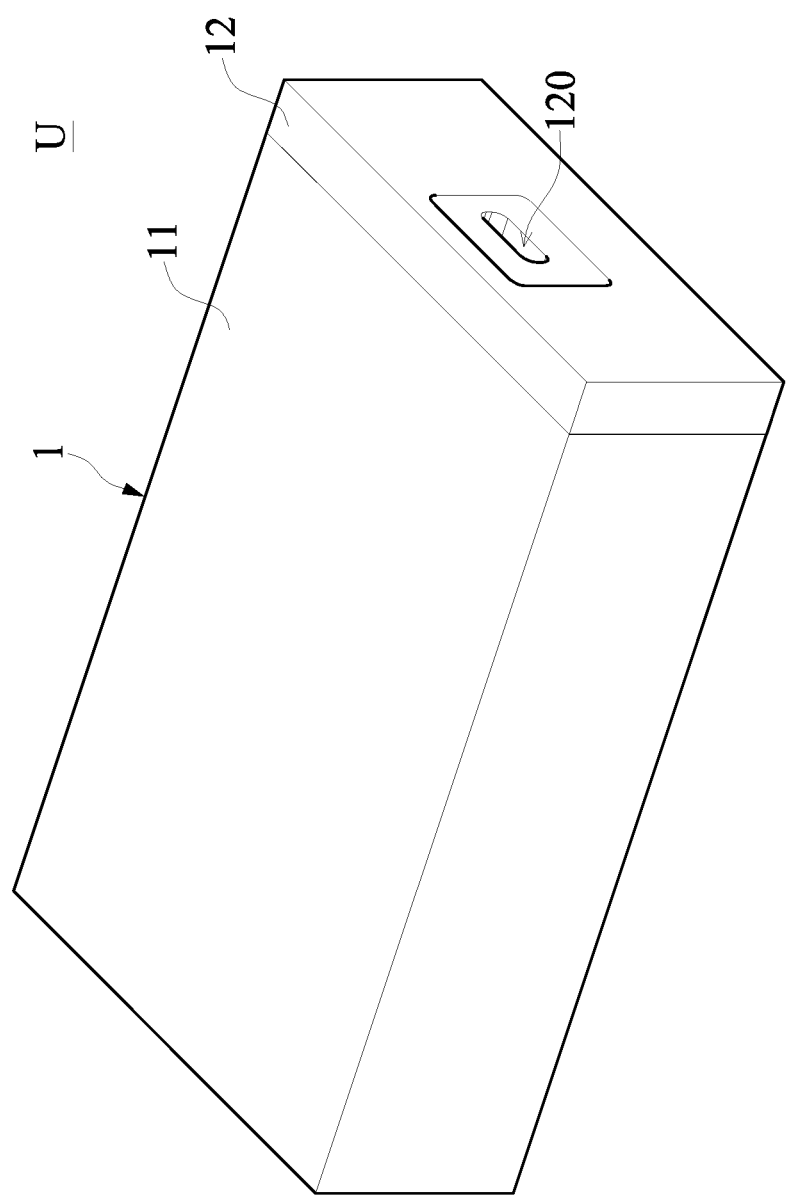
FIG. 1 is a perspective view of a storage device with a heat dissipation function according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
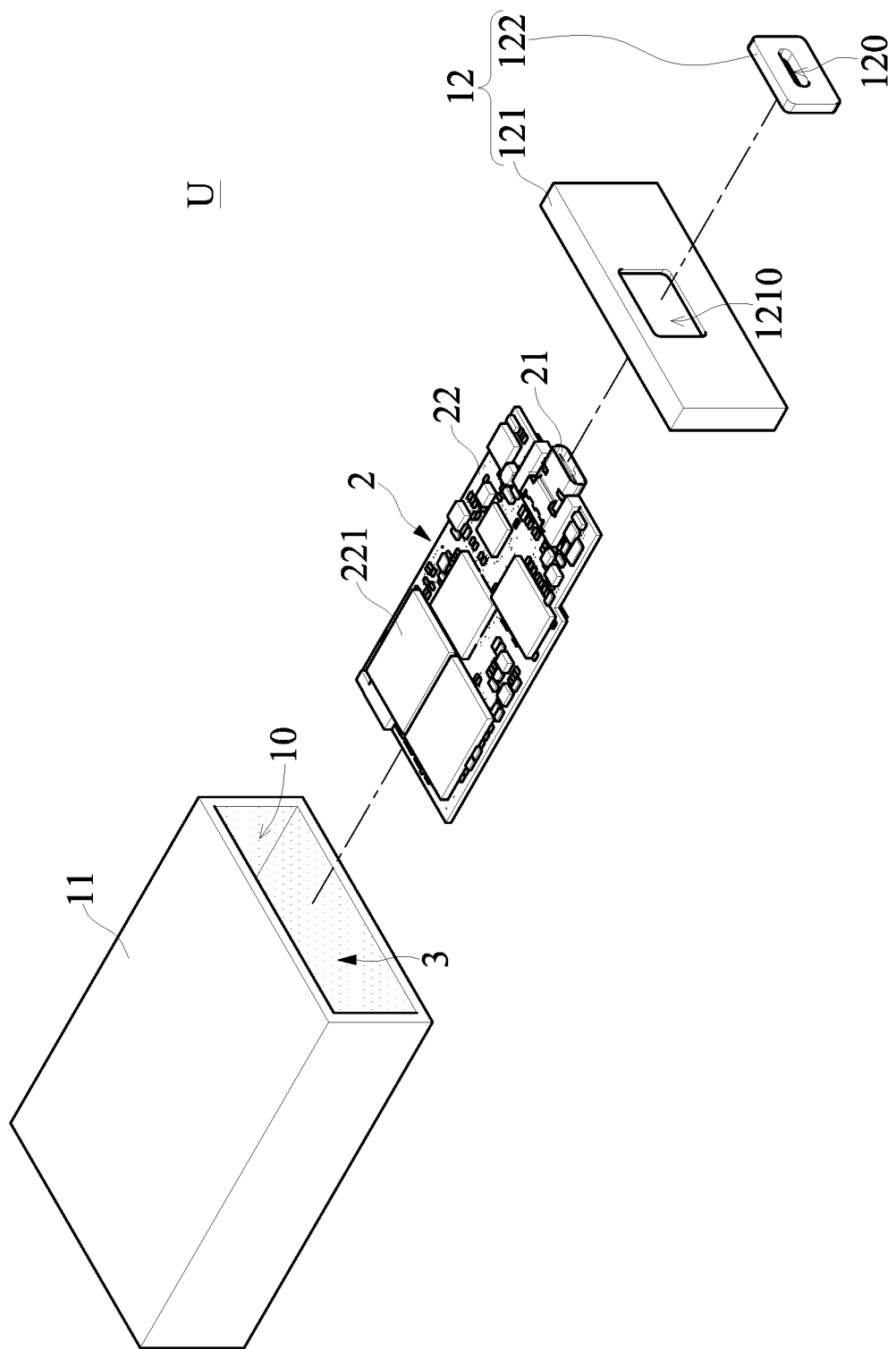
FIG. 2 is an exploded view of the storage device according to the first embodiment of the present disclosure.
Figure 3:
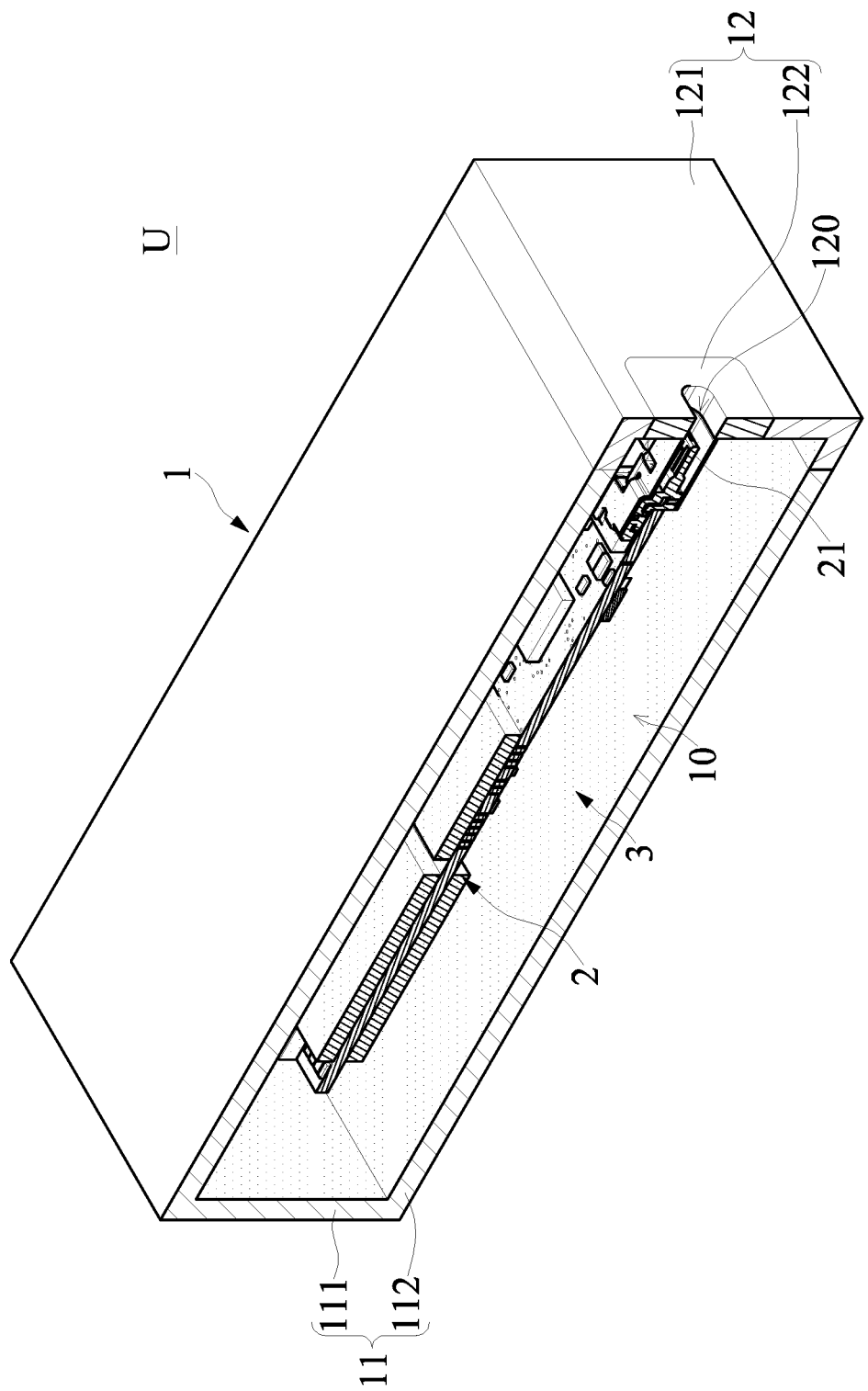
FIG. 3 is a cross-sectional view of the storage device according to the first embodiment of the present disclosure.

Referring to FIG. 1 to FIG. 3, FIG. 1 and FIG. 2 are respectively a perspective view and an exploded view of a storage device with a heat dissipation function according to a first embodiment of the present disclosure, and FIG. 3 is a cross-sectional view of the storage device according to the first embodiment of the present disclosure. The first embodiment of the present disclosure provides a storage device U with a heat dissipation function. The storage device U includes a case 1, a storage module 2 and a working fluid 3. It should be stated that, preferably, the storage device U provided by the embodiment of the present disclosure can be a hard drive; more preferably, the storage device U can be a portable external hard drive. However, in other embodiments, the storage device U can be an internal hard drive, and the present disclosure is not limited thereto. Also, it should be noted that the storage device U with the heat dissipation function can be a hard drive U with a heat dissipation function.

Based on the above, referring to FIG. 1 to FIG. 3 again, the case 1 includes an accommodation space 10, and the storage module 2 is disposed in the accommodation space 10 of the case 1. The working fluid 3 is disposed in the accommodation space 10 of the case 1 so that heat generated by the storage module 2 is conducted to the case 1 through the working fluid 3 so as to improve the efficiency of heat dissipation. In other words, in the embodiment of the present disclosure, a circuit board 22 of the storage module 2 contacts the working fluid 3 directly. Moreover, the working fluid 3 is packaged (or closed or sealed) in the accommodation space 10 of the case 1, and the working fluid 3 is not in contact with the external environment. That is to say, the working fluid 3 is sealed in the accommodation space 10 of the case 1 of the storage device (hard drive) U. It should be worth mentioning that in other embodiments (such as in a fourth embodiment), at least one portion of the storage module 2 can be disposed in the accommodation space 10 of the case 1. In this way, it is possible to only dispose the elements having a higher temperature in the accommodation space 10 and the working fluid 3. In other words, the present disclosure is not limited to whether the overall structure of the storage module 2 is completely immersed in the working fluid 3. In addition, a body portion 11 and a cover portion 12 of the case 1 may be made of metal, non-metal or plastic, and the present disclosure is not limited thereto.

Based on the above, referring to FIG. 2 again, the storage module 2 can be a hard drive (solid state drive, SSD) interface specification, for example. However, in other embodiments, the storage module 2 can be a hard disk drive (HDD) interface (not shown in the drawings), and the present disclosure is not limited thereto. It should be stated that the storage module 2 in the drawings of the present disclosure is illustrated as a solid hard drive interface specification. Furthermore, the storage module 2 includes a transmit port 21 and a circuit board 22. The circuit board 22 is coupled to the transmit port 21 and the circuit board 22 is disposed with a plurality of chips 221. The transmit port 21 is a connector that conforms SATA, mSATA, PCI-E, NVMe, M.2, M.3, ZIF, IDE, U.2, CF, CFast or type-C interface specification, for example. Accordingly, the storage device U with the heat dissipation function provided by the embodiment of the present disclosure may be a 2.5-inch hard drive, a 3.5-inch hard drive, an internal hard drive or a portable external hard drive.

Figure 4:
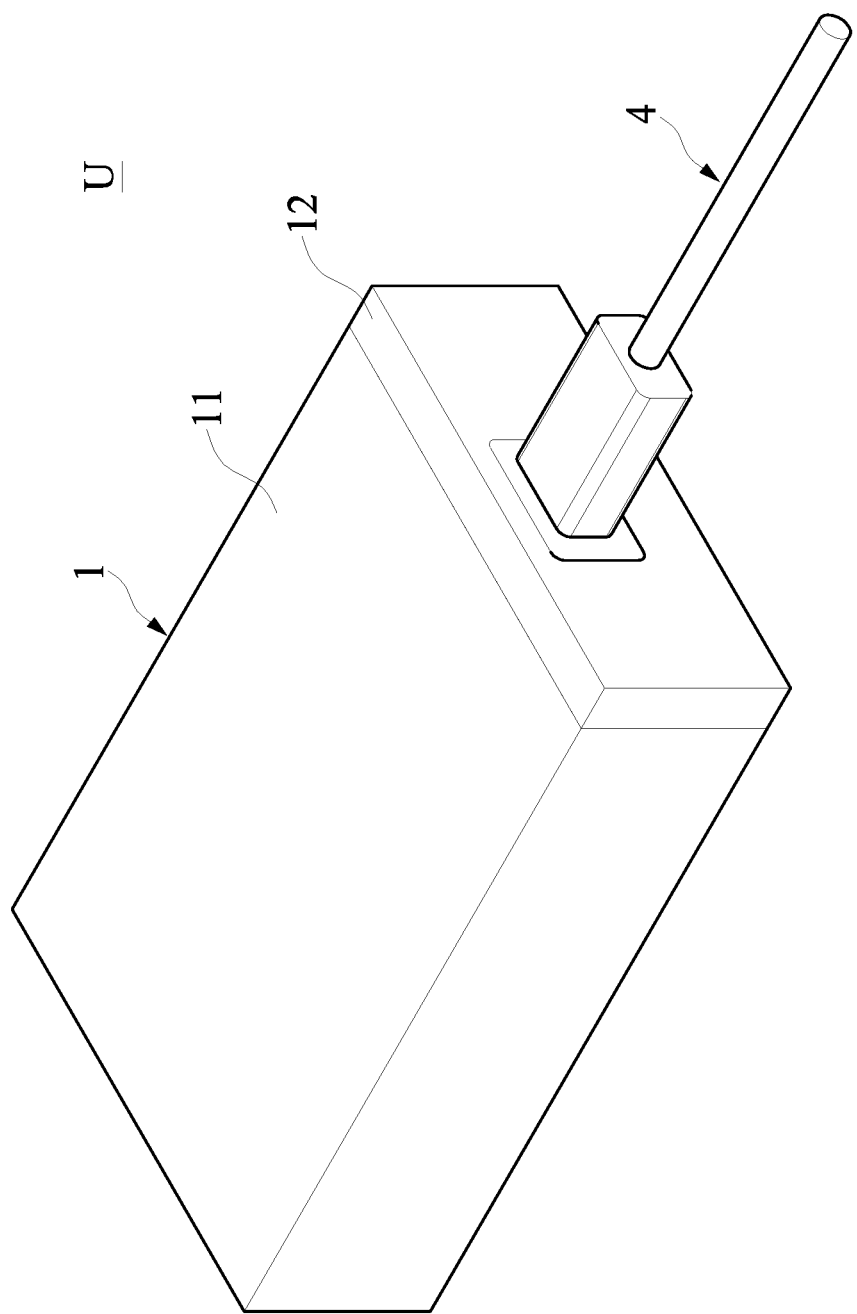
FIG. 4 is a schematic view of the of the storage device in use according to the first embodiment of the present disclosure.
Figure 5:
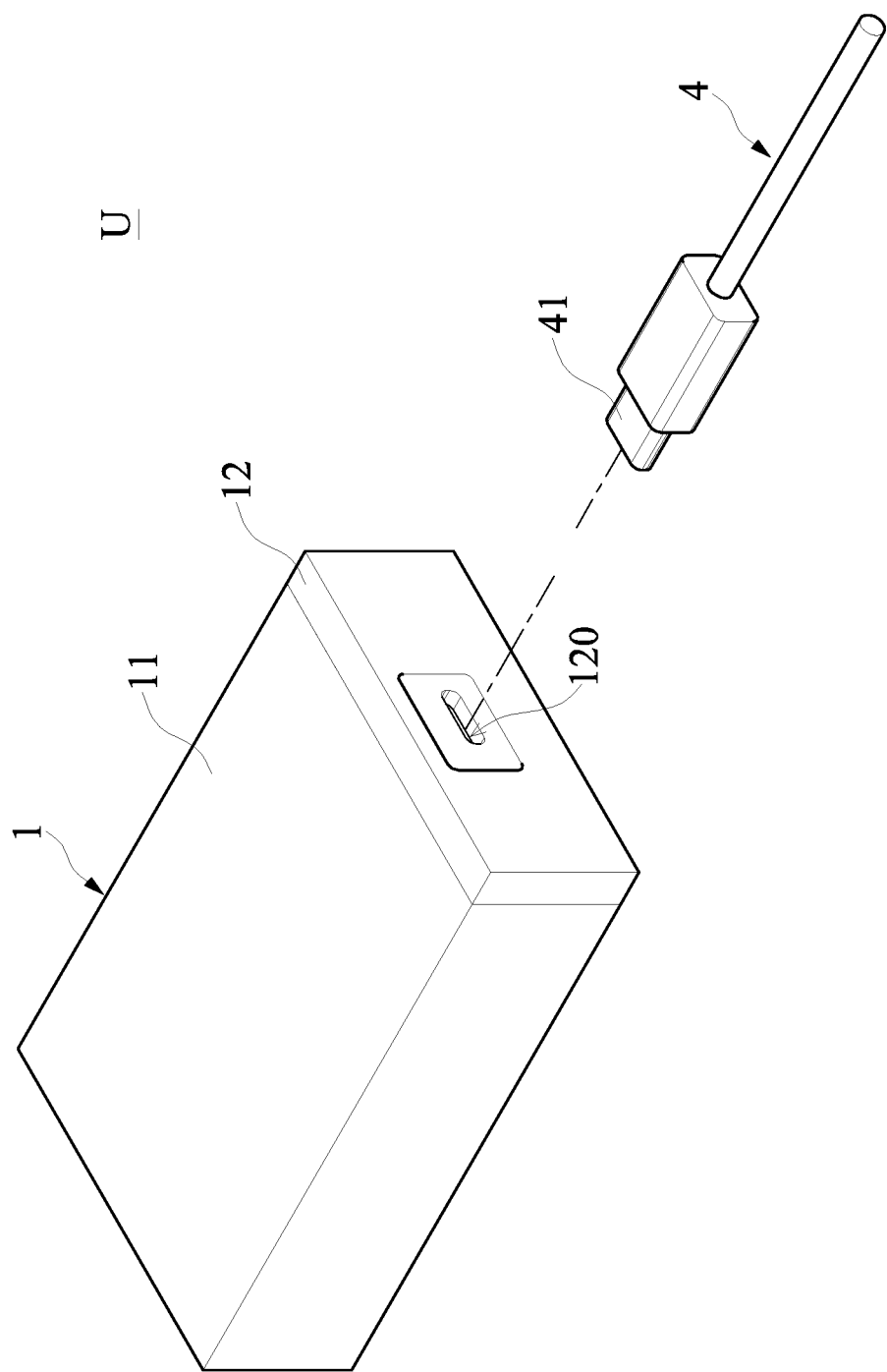
FIG. 5 is a schematic view of the of the storage device in use according to the first embodiment of the present disclosure.

Again, referring to FIG. 1 in conjunction with FIG. 4 and FIG. 5, FIG. 4 and FIG. 5 are schematic views of the storage device in use according to the first embodiment of the present disclosure. Further, the case 1 includes a slot body 120, and the transmit port 21 of the storage module 2 is disposed in the slot body 120. The transmit port 21 of the storage module 2 is exposed outside the accommodation space 10 of the case 1 through the slot body 120 of the case 1. Accordingly, a transmission end 41 of a transmission line 4 passes through the slot body 120 and is connected to the transmit port 21 of the storage module 2. It is worth mentioning that the transmit port 21 and the transmission end 41 of the transmission line 4 in the drawings are exemplified as the type-C interface specification, but in other embodiments, the transmit port 21 and the transmission end 41 may be a connector of other interface specifications, which is not limited in the present disclosure.

Again, referring to FIG. 2 and FIG. 3, the case 1 includes the body portion 11 and the cover portion 12 disposed on the body portion 11, and the accommodation space 10 is formed between the body portion 11 and the cover portion 12 to accommodate the circuit board 22 of the storage module 2 and the working fluid 3. Moreover, the body portion 11 includes a bottom plate 111 and a case plate 112 connected with the bottom plate 111 and surrounding the bottom plate 111. The case plate 112 extends toward the cover portion 12 relative to the bottom plate 111. Preferably, in the embodiment of the present disclosure, the bottom plate 111 and the case plate 112 of the body portion 11 may be an integrally formed structure. Accordingly, the body portion 11 forms a cup structure for accommodating the working fluid 3, which prevents the working fluid 3 from leaking out. Preferably, the storage module 2 is disposed on the cover portion 12 and the cover portion 12 is disposed on the case plate 112. For instance, the storage module 2 is locked on the cover portion 12 by a lock fastener (not shown in the drawings) or is fixed on the cover portion 12 by a buckle member (not shown in the drawings). Therefore, the cover portion 12 disposed with the storage module 2 can be directly combined with the body portion 11 having the working fluid 3 so as to form the storage device U with the heat dissipation function. However, it should be stated that the present disclosure is not limited to the form in which the storage module 2 is disposed in the case 1.

Based on the above, referring to FIG. 1 and FIG. 2 again, the manner of combining the cover portion 12 and the body portion 11 can be implemented by a lock fastener (not shown in the drawings). In other embodiments, the cover portion 12 may be combined with the body portion 11 by buckling (not shown in the drawings) the cover portion 12 and the body portion 11 together. Further, in other embodiments, the cover portion 12 and the body portion 11 can be combined by gluing (such as using glue or a tape, not shown in the drawings) together. The present disclosure is not limited to the manner of combining the cover portion 12 with the body portion 11 as long as the cover portion 12 is combined with the body portion to prevent the working fluid 3 from leaking out. Preferably, in one embodiment, a rubber gasket (not shown in the drawings) may be further disposed between the cover portion 12 and the body portion 11 to improve the adhesion between the cover portion 12 and the body portion 11, thereby preventing the working fluid 3 from leaking out. It is worth mentioning that in one embodiment, the case plate 112 of the body portion 11 may have a guide track (not shown in the drawings) corresponding to the storage module 2, so that the storage module 2 can slide along the guide track to facilitate the combination of the cover portion 12 disposed with the storage module 2 and the case plate 112 of the body portion 11 disposed with the working fluid 3. It is worth mentioning that in the embodiment of the present disclosure, the cover portion 12 may further include a first cover plate 121 and a second cover plate 112. The first cover plate 121 includes an opening slot 1210, the second cover plate 122 is disposed in the opening slot 1210, and the second cover plate 112 has the slot body 120. However, it should be stated that in other embodiments, the first cover plate 121 and the second cover plate 122 may be integrally formed, and the present disclosure is not limited thereto.

Again, referring to FIG. 1 to FIG. 3, the working fluid 3 may be an insulating liquid or a dielectric liquid having an effect of heat conduction, for example, a liquid having the boiling point lower than 76° C.; preferably, a liquid having the boiling point lower 65; more specifically, a liquid having hydrofluoroether. That is, the present disclosure may use a pure compound or an azeotropic mixture, such as an electron fluorinated liquid and a fluorine solution, having the boiling point of 62° C., 55° C. or 48° C., to serve as the working fluid 3, but is not limited thereto. Further, in one embodiment, the working fluid 3 can be the 3M™ Novec™ Engineered Fluid and the model number can be 7100 Engineered Fluid, 7200 Engineered Fluid, 7300 Engineered Fluid or 7500 Engineered Fluid, and the present disclosure is not limited thereto. Further, the working fluid 3 may be the 3M™ Fluorinert™ Electronic Liquid, and the present disclosure is not limited thereto.

Based on the above, as the storage module 2 is directly in contact with the working fluid, the heat generated by the storage module 2 during operation is first transmitted to the working fluid 3 and then transmitted to the case 1. It is worth mentioning that when the working fluid 3 is a liquid having the low boiling point, the working fluid 3 is easily boiled by being heated. Consequently, the working fluid 3 rises in temperature and reaches the boiling point. The working fluid 3 can change phases from a liquid state to a gaseous state by using the received thermal energy. A large amount of heat is consumed during the phase change, which is helpful to improve the efficiency of heat dissipation of the storage module 2. In addition, during the abovementioned phase change of the working fluid 3 from the liquid state to the gaseous state, the working fluid 3 generates convection in the accommodation space 10, and also the working fluid 3 that changes from the liquid state to the gaseous state forms air bubbles to disturb the working fluid 3, resulting in boiling.

According to the above, the working liquid 3 may have a volume of 40% to 100% of the accommodation space 10 disposed with the storage module 2, for example. However, the present disclosure is not limited thereto. It is worth mentioning that in one embodiment, when the material of the case 1 is a colorless translucent body made of polycarbonate (PC) resin, a user can directly observe the boiling of the working liquid 3 with the naked eye and can easily know the condition of the heat dissipation.

Second Embodiment

Figure 6:
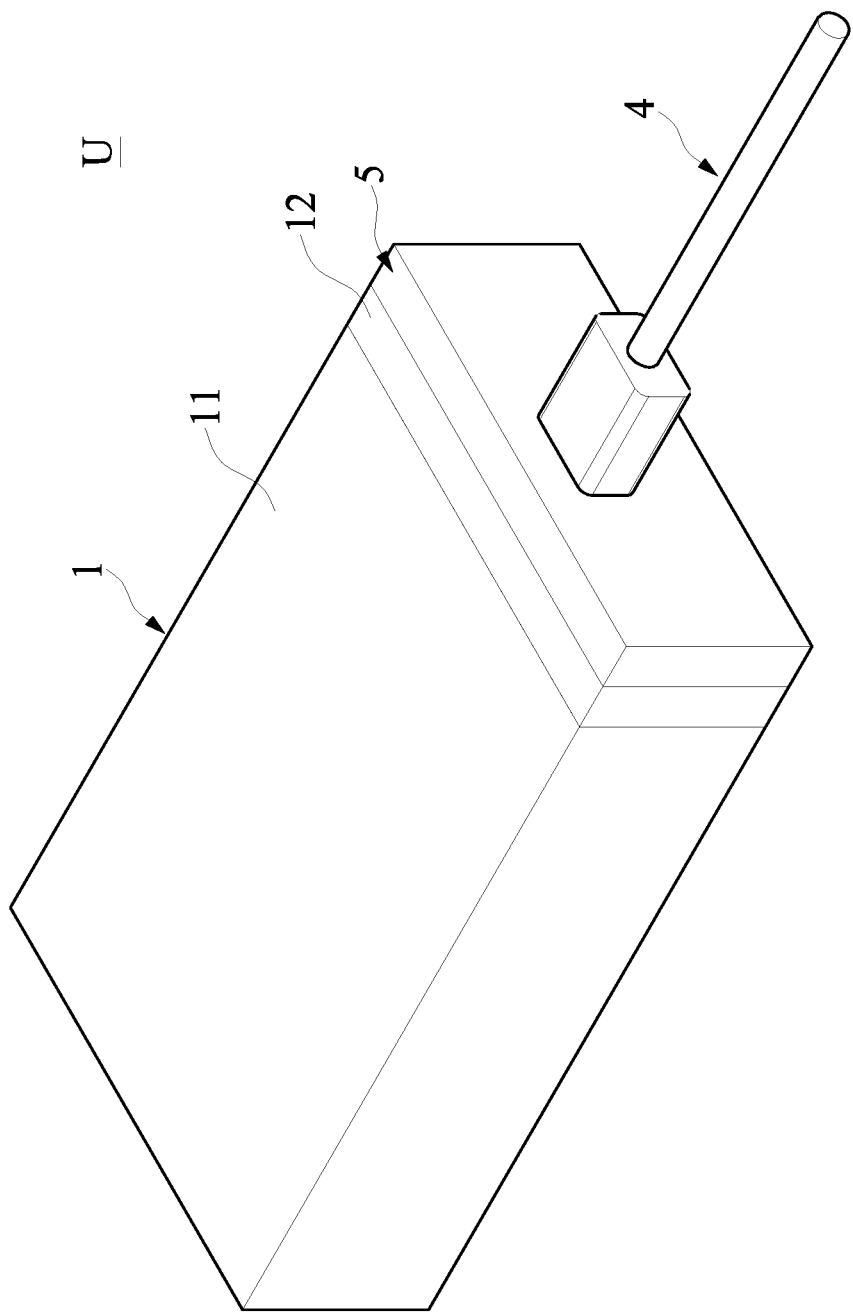
FIG. 6 is a perspective view of a storage device with a heat dissipation function according to a second embodiment of the present disclosure.
Figure 7:
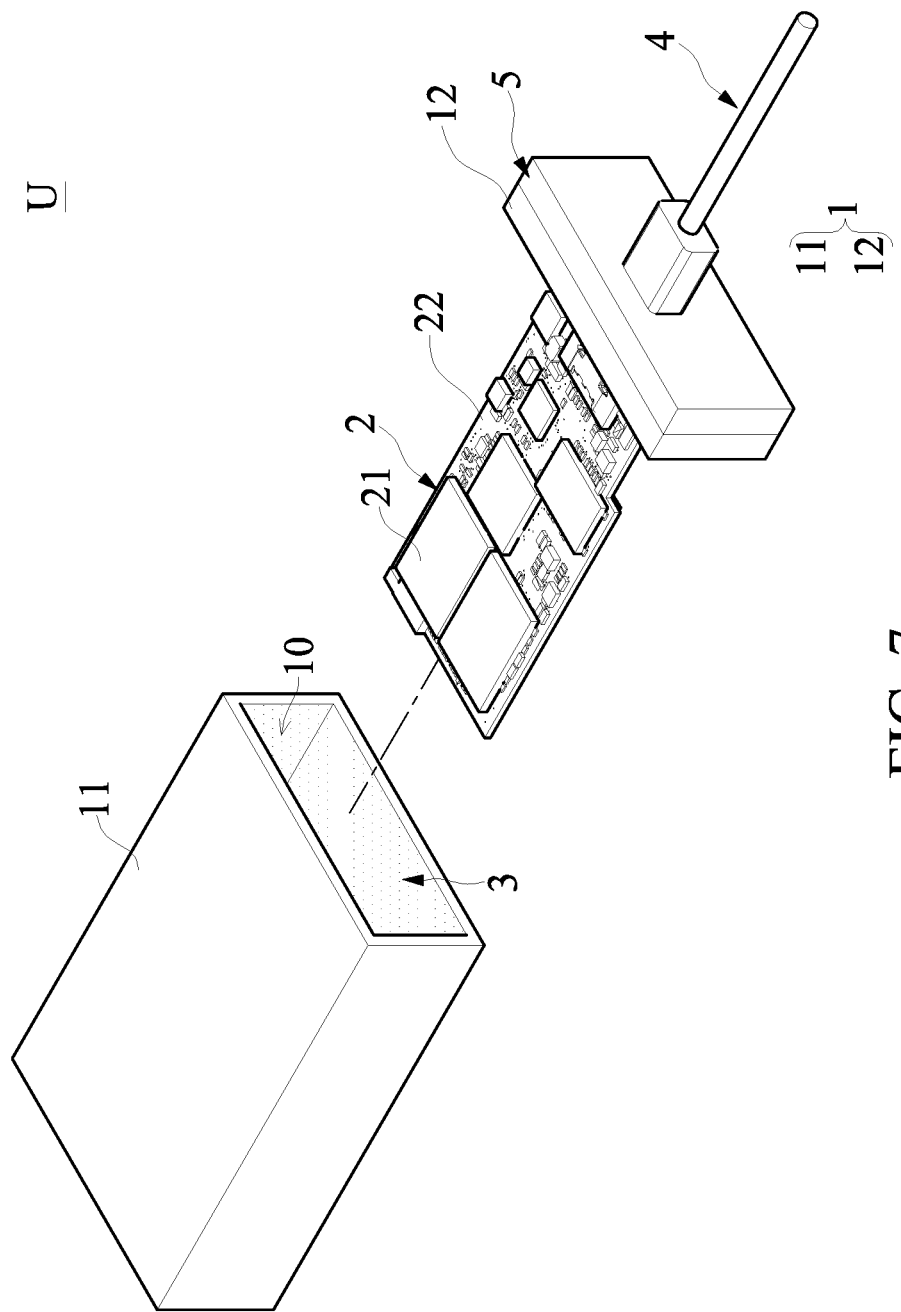
FIG. 7 is an exploded view of the storage device according to the second embodiment of the present disclosure.

Referring to FIG. 6 and FIG. 7, FIG. 6 is a perspective view of a storage device with a heat dissipation function according to a second embodiment of the present disclosure and FIG. 7 is an exploded view of the storage device according to the second embodiment of the present disclosure. By comparing FIG. 7 and FIG. 2, it is understandable that the most obvious difference between the second embodiment and the first embodiment is that, the storage device U with the heat dissipation function provided by the second embodiment may further include the transmission line 4, and the transmission line 4 is disposed on the cover portion 12. It should be stated that the structures of the case 1, the storage module 2 and the working fluid 3 are similar to those in the abovementioned embodiment, and should be omitted therein.

Based on the above, referring to FIG. 6 and FIG. 7 again, in conjunction with FIG. 4 and FIG. 5, in the second embodiment, the transmission end 41 of the transmission line 4 passes through the slot body 120 and is connected to the transmit port 21 of the storage module 2 as mentioned in the above embodiment. Then, a package 5 covers the transmission end 41 and the slot body 120 so that the transmission line 4 is disposed on the cover portion 12. At the same time, the package 5 may further provide an effect of sealing between the transmission end 41 and the slot body 120. In addition, the storage module 2, as mentioned in the above embodiment, is disposed on the cover portion 12, but the present disclosure is not limited thereto.

It is worth mentioning that in one embodiment, the package 5 and the cover portion 12 may be of the same material and integrally formed, such that the transmission end 41 of the transmission line 4 is disposed on the cover portion 12 and the transmission end 41 of the transmission line 4 is connected with the transmit port 21 of the storage module 2 disposed on the cover portion 12. Further, in another embodiment, the package 5 and the cover portion 12 may be the same element. In addition, it is worth mentioning that the package 5 may be merely disposed on the transmission end 41 and the slot body 120 without covering the overall cover portion 12, and the present disclosure is not limited thereto. Further, as mentioned before, the cover portion 12 may be combined with the body portion 11 by buckling the cover portion 12 and the body portion 11 together, or by gluing together. In other words, the cover portion 12 and the body portion 11 can be combined in a manner that can prevent the leakage of the working fluid 3 (not shown in FIG. 6 and FIG. 7) and the present disclosure does not limit the manner of combining the cover portion 12 with the body portion 11.

Third Embodiment

Figure 8:
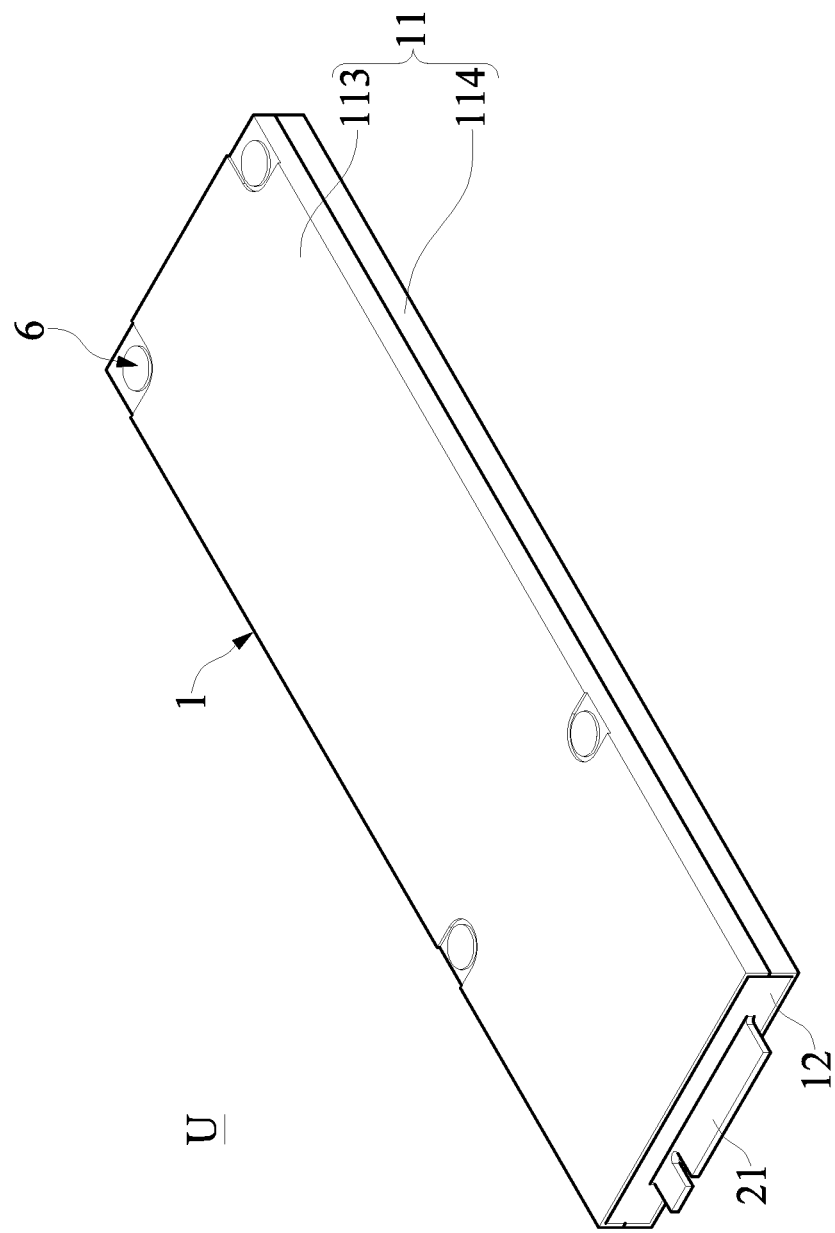
FIG. 8 is a perspective view of a storage device with a heat dissipation function according to a third embodiment of the present disclosure.
Figure 9:
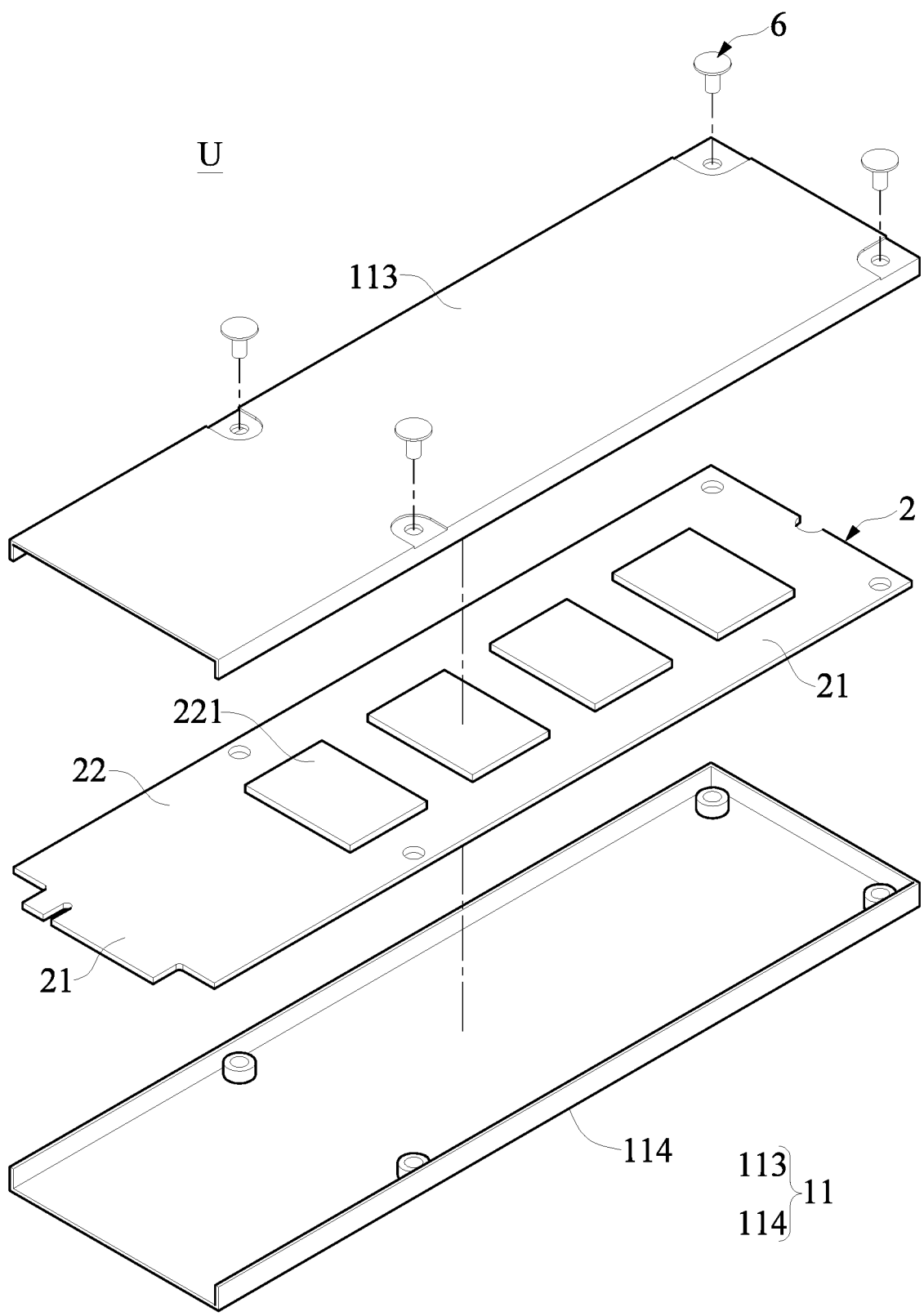
FIG. 9 is an exploded view of the storage device according to the third embodiment of the present disclosure.

Referring to FIG. 8 and FIG. 9, FIG. 8 is a perspective view of a storage device with a heat dissipation function according to a third embodiment of the present disclosure and FIG. 9 is an exploded view of the storage device according to the third embodiment of the present disclosure. By comparing FIG. 9 with FIG. 2, it is understandable that the most obvious difference between the third embodiment and the first embodiment is that, the transmit port 21 of the storage module 2 of the storage device U with the heat dissipation function provided by the third embodiment can be PCI-E interface specification. Also, the arrangement of the case 1 in the third embodiment is different from the above embodiments. However, it should be stated that the storage module 2 and the working fluid 3 of the storage device U with the heat dissipation function provided by the third embodiment are similar to those in the above embodiments, and should be omitted herein.

Based on the above, referring to FIG. 8 and FIG. 9 again, in the third embodiment, the case 1 may be composed of the body portion 11 and the cover portion 12. Compared with the above embodiments, the body portion 11 of the third embodiment may be composed of a first case plate 113 and a second case plate 114, and a lock fastener 6 may be used between the first case plate 113 and the second case plate 114 to combine the first case plate 113 with the second case plate 114, but the present disclosure is not limited thereto. It is worth mentioning that a rubber gasket (not shown in the drawings) may be further disposed between the first case plate 113 and the second case plate 114 to improve the adhesion between the first case plate 113 and the second case plate 114. In addition, in the third embodiment, the cover portion 12 may be a colloid used to close a gap formed between the first case plate 113 and the second case plate 114, but the present disclosure is not limited thereto. In other embodiments, the gap formed between the first case plate 113 and the second case plate 114 may be closed by ultrasonic welding to further form the cover portion 12.

Fourth Embodiment

Figure 10:
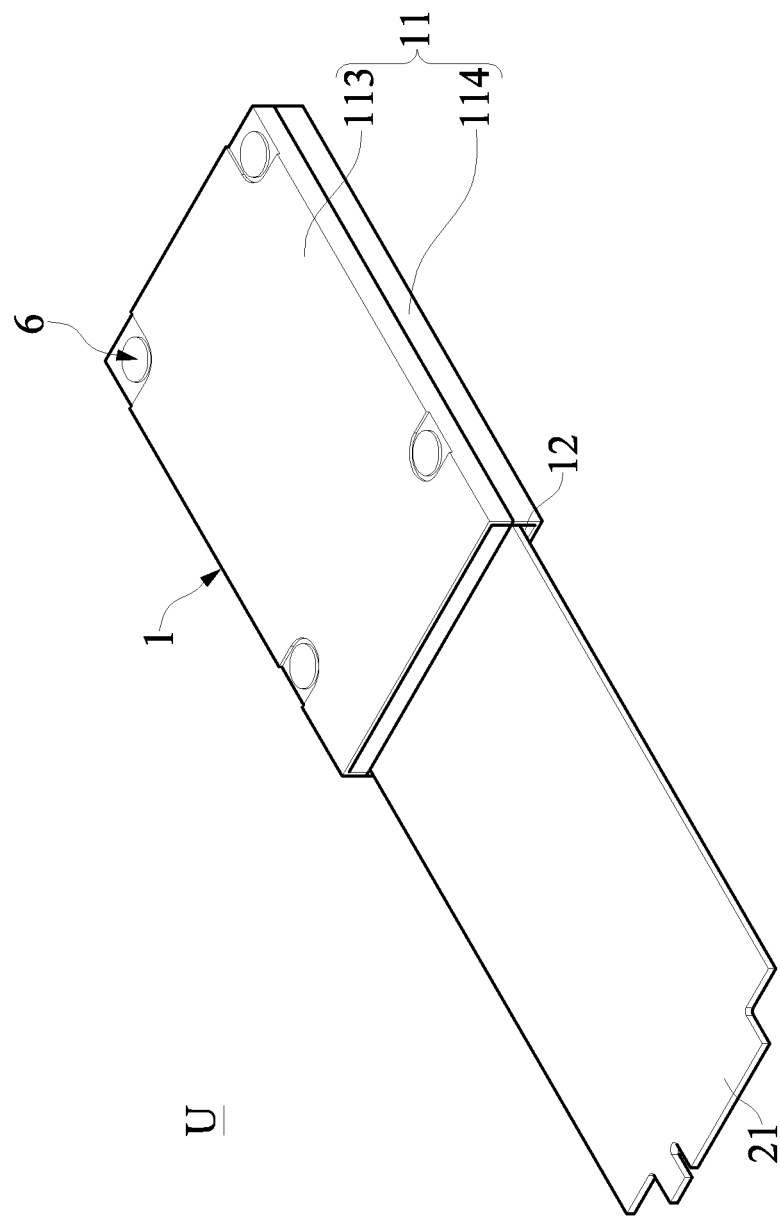
FIG. 10 is a perspective view of a storage device with a heat dissipation function according to a fourth embodiment of the present disclosure.
Figure 11:
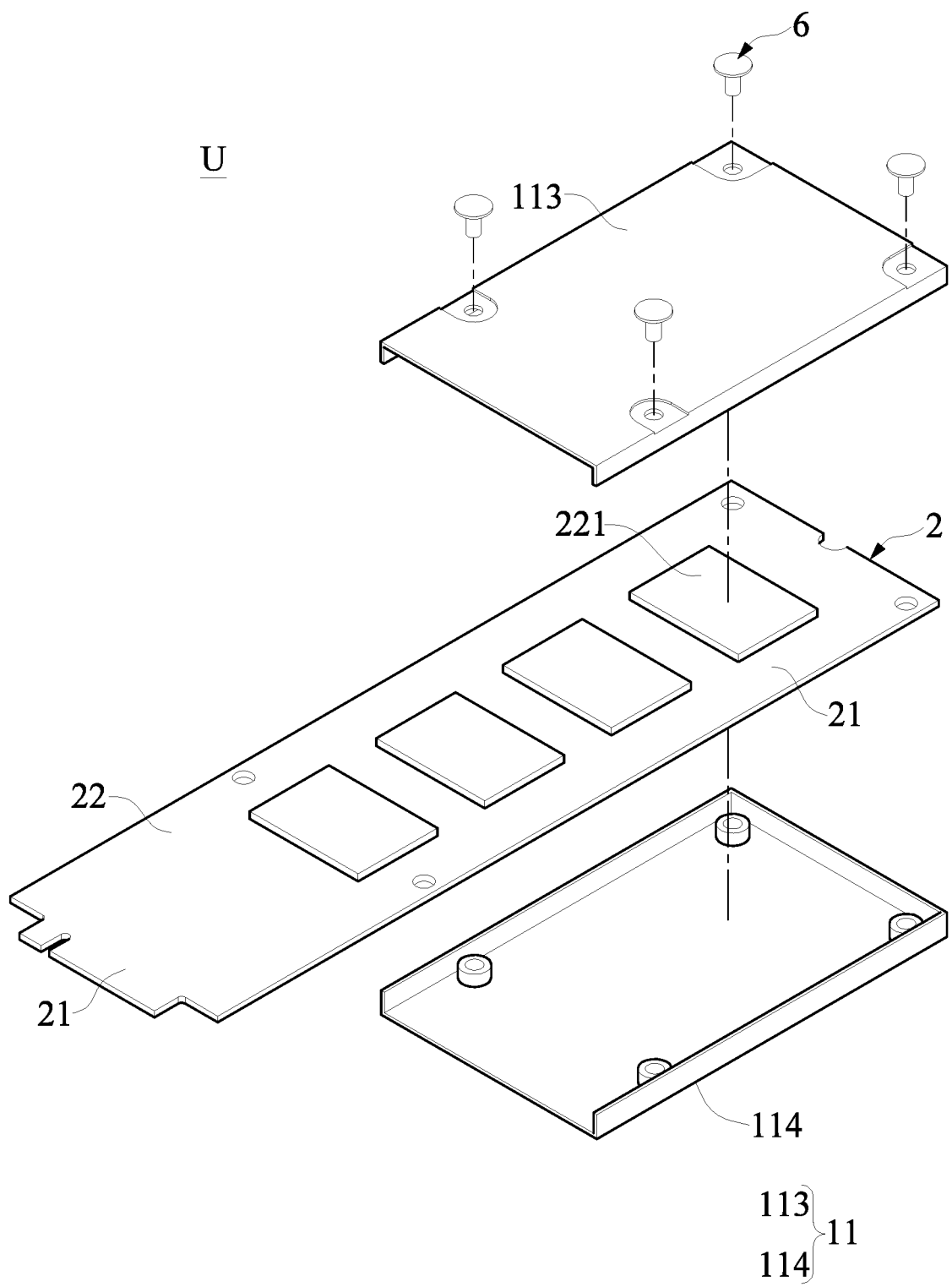
FIG. 11 is an exploded view of the storage device according to the fourth embodiment of the present disclosure.

Referring to FIG. 10 and FIG. 11, FIG. 10 is a perspective view of a storage device with a heat dissipation function according to a fourth embodiment of the present disclosure, and FIG. 11 is an exploded view of the storage device according to the fourth embodiment of the present disclosure. By comparing FIG. 10 and FIG. 8, the most obvious difference between the fourth embodiment and the third embodiment is that, the storage device U with the heat dissipation function provided by the fourth embodiment can provide merely a portion of the storage module 2 in the accommodation space 10 in the case 1. That is, it is possible to merely dispose the elements having a higher temperature in the accommodation space 10 of the case 1 and in the working fluid 3. It should be stated that the storage module 2 and the working fluid 3 of the storage device U with the heat dissipation function provided by the fourth embodiment are still similar to those in the above embodiments, and should be omitted therein.

Specifically, referring to FIG. 10 and FIG. 11, a portion of the circuit board 22, one of the chips 221 on the circuit board 22 and the working fluid 3 (not shown in FIG. 10 and FIG. 11) are disposed in the case 1. In addition, compared with the third embodiment, the body portion 11 of the case 1 of the fourth embodiment can be composed of the bottom plate 111 and the case plate 112. Moreover, the cover portion 12 of the case 1 of the fourth embodiment can be a colloid as mentioned in the third embodiment to close the gap formed between the storage module 2 and the case plate 112 of the body portion 11, but the present disclosure is not limited thereto. In other embodiments, the gap formed between the storage module 2 and the case plate 112 of the body portion 11 can be closed by ultrasonic welding to further form the cover portion 12.

Fifth Embodiment

Figure 12:
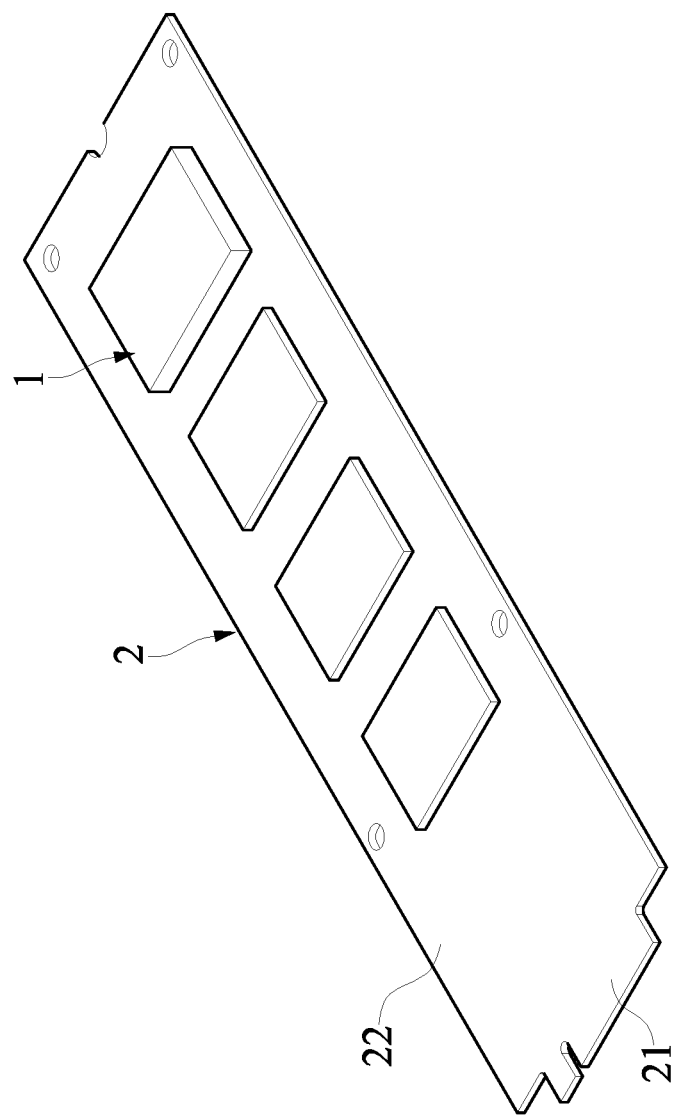
FIG. 12 is a perspective view of a storage device with a heat dissipation function according to a fifth embodiment of the present disclosure.
Figure 13:
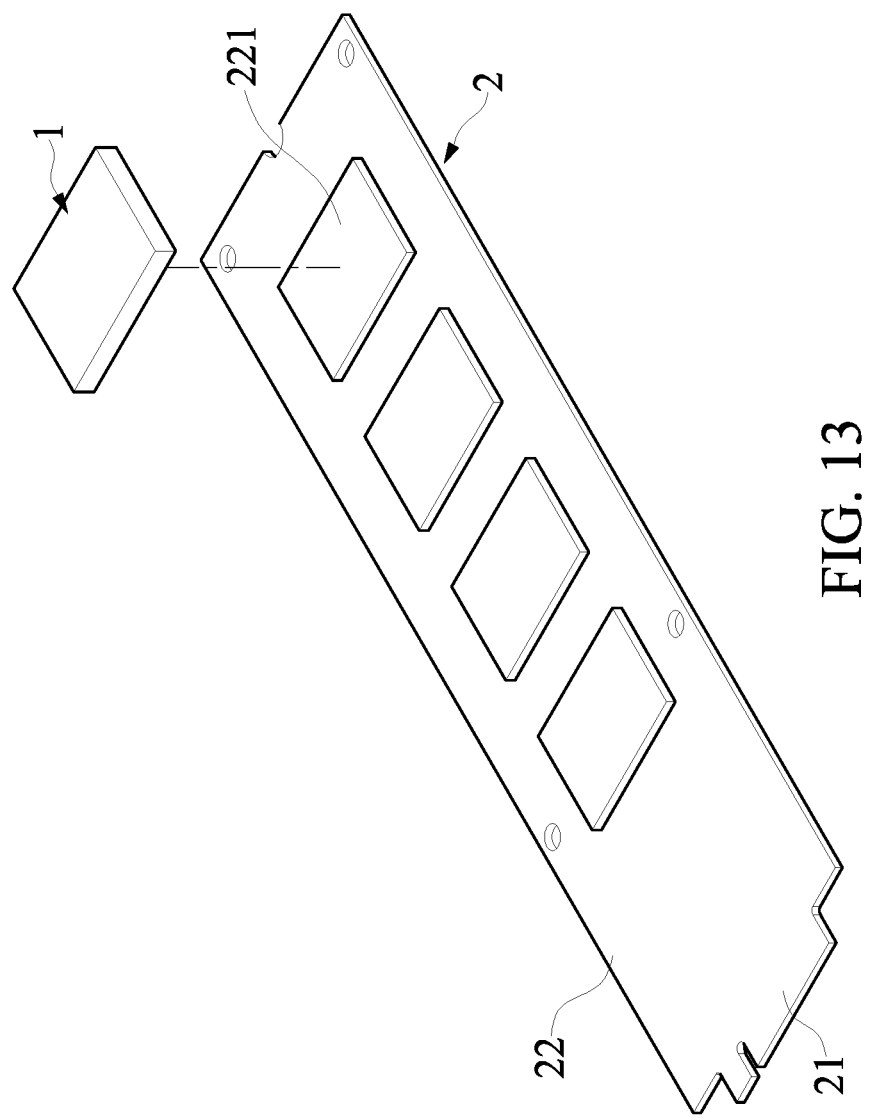
FIG. 13 is an exploded view of the storage device according to the fifth embodiment of the present disclosure.
Figure 14:
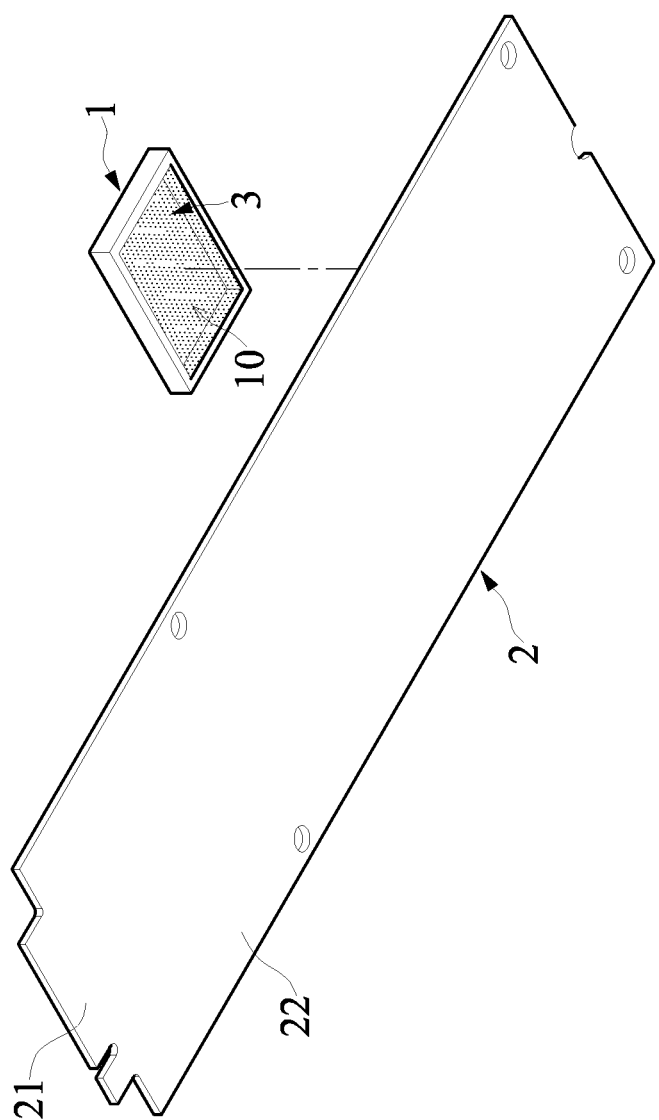
FIG. 14 is an exploded view of the storage device according to the fifth embodiment of the present disclosure.

Referring to FIG. 12 to FIG. 14, FIG. 12 is a perspective view of a storage device with a heat dissipation function according to a fifth embodiment of the present disclosure, and FIG. 13 and FIG. 14 are exploded views of the storage device according to the fifth embodiment of the present disclosure. By comparing FIG. 12 and FIG. 10, it is understandable that the most obvious difference between the fifth embodiment and the fourth embodiment is that, the arrangement of the case 1 of the storage device U with the heat dissipation function provided by the fifth embodiment is different from that in the fourth embodiment. However, it should be stated that the storage module 2 and the working fluid 3 of the storage device U with the heat dissipation function provided by the fifth embodiment are still similar to those in the above embodiments, and should be omitted herein.

Based on the above, referring to FIG. 12 to FIG. 14 again, the case 1 accommodating the working fluid 3 can cover one of the chips 221 which is easier heated, so that the chip 221 which is easier heated is immersed in the working fluid 3. Accordingly, the heat generated by the chip 221 of the storage module 3 can be conducted from the working fluid 3 to the case 1.

One of the beneficial effects of the present disclosure is that, with the technical solution that "the working fluid 3 is disposed in the accommodation space 10 of the case 1, and the storage module 2 is immersed in the working fluid 3," the storage device U and the hard drive U with the heat dissipation function provided by the embodiment of the present disclosure improve the efficiency of heat dissipation of the storage device U and the hard drive U. Therefore, the heat generated by the storage module 2 can be quickly transmitted from the working fluid 3 to the case 1 through the working fluid 3, so as to prevent the storage device U and the hard drive U from overheating and a decrease in the transmission speed.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A hard drive with a heat dissipation function, comprising:
   a case including an accommodation space, wherein the case includes a body portion and a cover portion disposed on the body portion, and the accommodation space is formed between the body portion and the cover portion;
   a storage module disposed in the accommodation space of the case; and a working fluid disposed in the accommodation space of the case, wherein the storage module is immersed in the working fluid so that heat generated by the storage module is conducted from the working fluid to the case;
wherein the working fluid is sealed in the accommodation space of the case, and the working fluid is not in contact with an external environment;
wherein a circuit board of the storage module is in contact with the working fluid directly.

2. The hard drive according to claim 1, wherein, the cover portion includes a slot body, and a transmit port of the storage module is disposed in the slot body.

3. The hard drive according to claim 2, wherein the cover portion further includes a first cover plate and a second cover plate, the first cover plate includes an opening slot, the second cover plate is disposed in the opening slot, and the second cover plate includes the slot body.

4. The hard drive according to claim 2 further comprising: a transmission line, wherein a transmission end of the transmission line passes through the slot body and is connected to the storage module.

5. The hard drive according to claim 4 further comprising: a package, wherein the package covers the transmission end of the transmission line and the slot body so that the transmission line is disposed on the cover portion.

6. The hard drive according to claim 1, wherein, the storage module includes a transmit port, the case includes a slot body and the transmit port of the storage module is exposed through the slot body of the case.

7. The hard drive according to claim 6, wherein, the transmit port is a connector that conforms to an SATA, mSATA, PCI-E, NVMe, M.2, ZIF, IDE, U.2, CF, CFast or type-C interface.

8. The hard drive according to claim 7, wherein the storage module further includes a circuit board coupled to the transmit port.

9. The hard drive according to claim 1, wherein, the hard drive is a 2.5-inch hard drive, a 3.5-inch hard drive, an internal hard drive or a portable external hard drive.

10. The hard drive according to claim 1, wherein the storage module is a solid state drive interface specification or a hard disk drive interface specification.

11. The hard drive according to claim 1, wherein, the working fluid is an insulating liquid.

12. The hard drive according to claim 1, wherein at least one portion of the storage module is disposed in the accommodation space of the case.

13. A storage device with a heat dissipation function, comprising:
a case including an accommodation space, wherein the case includes a body portion and a cover portion disposed on the body portion, and the accommodation space is formed between the body portion and the cover portion;
a storage module disposed in the accommodation space of the case; and
a working fluid disposed in the accommodation space of the case, wherein the storage module is immersed in the working fluid;
wherein the working fluid is sealed in the accommodation space of the case, and the working fluid is not in contact with an external environment;
wherein a circuit board of the storage module is in contact with the working fluid directly.

14. The storage device according to claim 13, wherein, the storage device is a 2.5-inch hard drive, a 3.5-inch hard drive, an internal hard drive or a portable external hard drive.

15. The storage device according to claim 13, wherein, the working fluid is an insulating liquid.

* * * * *